(12) United States Patent
Kong et al.

(10) Patent No.: US 9,692,448 B1
(45) Date of Patent: Jun. 27, 2017

(54) SPLIT CHIP SOLUTION FOR DIE-TO-DIE SERDES

(71) Applicant: QUALCOMM Incorporated, San Diego, CA (US)

(72) Inventors: Xiaohua Kong, San Diego, CA (US); Mohamed Allam, Rancho Santa Fe, CA (US); Esin Terzioglu, San Diego, CA (US); Jose Gilberto Corleto Mena, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/273,621

(22) Filed: Sep. 22, 2016

(51) Int. Cl.
 *H03M 9/00* (2006.01)
 *G05F 3/16* (2006.01)
 *H03L 7/08* (2006.01)

(52) U.S. Cl.
 CPC ............... *H03M 9/00* (2013.01); *G05F 3/16* (2013.01); *H03L 7/0807* (2013.01)

(58) Field of Classification Search
 None
 See application file for complete search history.

(56) References Cited

U.S. PATENT DOCUMENTS

| | | | |
|---|---|---|---|
| 7,227,918 B2 * | 6/2007 | Aung | H03M 9/00 375/355 |
| 7,537,960 B2 | 5/2009 | Kelly et al. | |
| 8,595,672 B2 | 11/2013 | Herbst | |
| 8,890,332 B2 * | 11/2014 | Miller | H01L 23/5384 257/777 |
| 9,285,421 B1 | 3/2016 | Azimi et al. | |
| 9,310,830 B2 | 4/2016 | Fiedler | |
| 2007/0194453 A1 * | 8/2007 | Chakraborty | H01L 23/49575 257/777 |
| 2015/0363349 A1 | 12/2015 | Remple et al. | |
| 2016/0293548 A1 * | 10/2016 | Karp | H01L 23/5382 |

* cited by examiner

*Primary Examiner* — Howard Williams
(74) *Attorney, Agent, or Firm* — Haynes and Boone, LLP

(57) ABSTRACT

An SoC integrated circuit package is provided in which the analog components of a SerDes for an SoC die in the SoC integrated circuit package are segregated into a SerDes interface die in the SoC integrated circuit package.

21 Claims, 5 Drawing Sheets

SPLIT CHIP SOLUTION FOR DIE-TO-DIE SERDES

TECHNICAL FIELD

This application relates generally to a serilizer-deserializer (SerDes), and more particularly to split-chip solution for a die-to-die SerDes.

BACKGROUND

To support the numerous functions provided by modern smartphones and related mobile devices, various system-on-a-chip (SoC) integrated circuits have been developed. An SoC will have a digital core incorporating a microprocessor and related elements such as a graphics processor. In addition, the SoC will need to support various interfaces to external devices such as a double data rate (DDR) memory, a Universal Serial Bus (USB), a high definition multimedia interface (HDMI), or a serializer-deserializer (SerDes) interface.

In contrast to the digital core for an SoC, a SerDes requires assorted analog components that are incorporated into a mixed digital/analog circuit domain. An example SoC 100 including a SerDes interface 105 in a digital/analog circuit domain is shown in FIG. 1. A controller 110 presents data words and control signals to a physical coding sublayer (PCS) circuit 115. A mixed signal digital domain 120 includes a built-in-self-test (BIST) and control circuits for SerDes interface 105. SerDes interface 105 includes a plurality of analog components such as a bandgap circuit (Bias), a phase-locked loop (PLL), electrostatic discharge (ESD) circuitry, and a low drop-out regulator (LDO) that assist in the serialization of data words from controller 110 (after processing through PCS circuit 115) in a transmit path that includes thresholding circuit 140, buffers 125 and a differential transmitter 130. Differential transmitter 130 transmits the serialized data words over a pair of differential output pins TX+ and TX−. Similarly, SerDes interface 105 receives serialized data words from an external source over a pair of differential input tenninals RX+ and RX− at a differential receiver 135. A signal detector (SigDet) monitors the RX+ and RX− to detect for the presence of incoming differential data. The resulting serial data from receiver 135 is equalized in an equalizer and sampled in a sampler responsive to a clock from a clock data recovery (CDR) circuit. An analogous equalizer may be included in the transmit path. A de-serializer deserializes the sampled received data from the sampler so that the received data words may be processed through PCS circuit 115 and presented to controller 110 as received data and control words.

Although such a SerDes interface 105 is conventional, the design of its analog components is becoming more and more difficult at the advanced technology nodes. For example, transmitter 130 and receiver 135 are sensitive to noise. The bandgap reference and the LDO are sensitive to the voltage headroom issues that develop as the power supply voltage is continually decreased at the advanced technology nodes. The PLL design is also problematic in that a high-precision clock is critical for error-free operation of SerDes interface 105. Moreover, analog components in advanced process nodes retain their relatively large size as compared to the digital components and thus consume substantial die area and increase cost. In contrast, the design of the digital core in SoC 100 that includes controller 110 as well as a microprocessor (not illustrated) is less noise sensitive and time consuming to design. Moreover, the digital components consume less die space. The design of SerDes interface 105 is thus becoming a bottleneck as SoC designs are continually updated to newer technology nodes.

Accordingly, there is a need in the art for improved SerDes interfaces.

SUMMARY

To simplify and streamline the evolution of digital integrated circuits such as an SoC to new technology nodes, the SerDes interface is segregated to a separate SerDes interface die. The analog components such as the PLL, the equalizer, transmitter, LDO, and receiver are thus removed from the SoC die to the SerDes interface die. The long development cycles for evolving the analog components of the SerDes interface for an SoC are thus solved since the design for the separate interface die may be frozen with respect to the SoC. In other words, the SoC may continue to evolve to newer technology nodes—e.g., from a planar complementary metal oxide semiconductor (CMOS) node to a fm-shaped field effect transistor (FinFET) node and from the FinFET node to a nanowire device node, and so on without requiring any redesign of the SerDes interface die. For brevity, the terms "SoC" and "SoC die" are used interchangeably herein. Similarly, the terms "SerDes interface die" and "SerDes interface" are also used interchangeably herein.

The SOC and the SerDes interface are integrated into a single package such as a package-on-package (PoP). The resulting single package (denoted herein as the "SoC package") may then be integrated into a mobile device such as a smartphone. The SerDes interface transmits a serialized data stream from the SoC package over an external transmission line to a separate integrated circuit (or circuits) within the mobile device. Similarly, the SerDes interface receives a serialized data stream from this external transmission line. In contrast to the SoC and the SerDes interface, the SoC manufacturer may have no control over the electrical characteristics of this external transmission line. The SerDes interface must thus be designed to be robust to these uncertainties in the external transmission line. In contrast, the SoC manufacturer has direct control over an internal transmission channel that couples the SoC to the SerDes interface in the SoC package. The electrical characteristics of the internal transmission channel may thus be controlled so as to have relatively small parasitic capacitance and parasitic inductance.

The SoC couples to the internal transmission channel through a physical (PHY) layer SoC interface. Similarly, the SerDes interface couples to the internal transmission channel through a corresponding SerDes PHY layer interface. But given the control over the electrical characteristics of the internal transmission channel, the tolerances for the PHY interfaces in the SoC and the SerDes interface are relaxed. For example, the SoC PHY interface may function to serialize a data word from a controller in the SoC into a serial data stream driven to the PHY interface for the SerDes interface. Since the SerDes interface includes the analog components such as a phase-locked loop (PLL), the PLL in the SerDes interface transmits a PLL clock through the SerDes PHY interface to the SoC PHY interface so that the SoC PHY interface may serialize the data word from the SoC controller responsive to the PLL clock. The SoC PHY interface may thus be designated as a "light" SoC PHY interface in that it need not be burdened with the clock generation. Moreover, since the electrical characteristics of the internal transmission channel are controlled to be favorable, the SoC PHY interface need not equalize the serial data stream driven to the SerDes PHY interface. Alternatively, the SoC PHY interface need only provide rudimentary equalization, which again relieves the design burden for the SoC PHY interface.

The SerDes PHY interface may also be designated as a "light" SerDes PHY interface in that it need not use any equalization on the received serial data stream from the SoC PHY interface given the favorable electrical characteristics of the internal transmission channel. Alternatively, the SerDes PHY interface need only provide rudimentary equalization in light of these favorable electrical characteristics. With the analog components segregated into the SerDes interface, the design of the SoC is thus greatly simplified.

These and additional advantages may be better appreciated through the following detailed description.

BRIEF DESCRIPTION OF THE DRAWINGS

These aspects of the disclosure and their advantages are best understood by referring to the detailed description that follows. It should be appreciated that like reference numerals are used to identify like elements illustrated in one or more of the figures.

DETAILED DESCRIPTION

Figure 1:
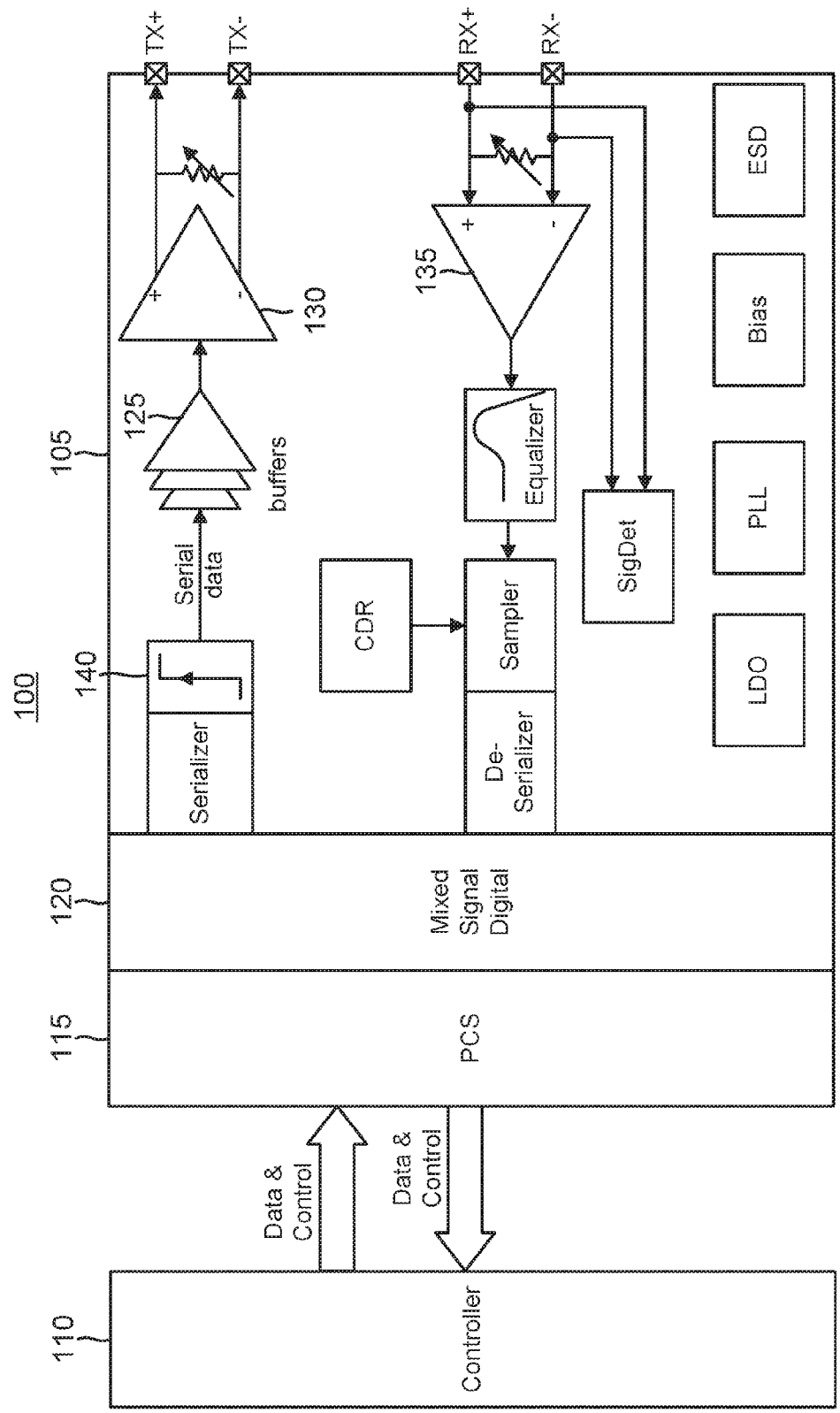
FIG. 1 is a diagram of a conventional SoC including a SerDes interface.

To alleviate the design bottleneck caused by the SerDes interface in SoC evolution, the SerDes interface is segregated into a SerDes interface die. An SoC die is packaged with the SerDes interface die in an SoC integrated circuit package containing an internal transmission channel. A controller in the SoC die generates data and control signals for the SerDes interface die that are transmitted through the internal transmission channel. The SerDes interface die serializes the data from the controller into a serial data stream that is transmitted over an external transmission line in a mobile device such as a smartphone to another die or integrated circuit package within the mobile device.

An SoC designer may control the design of both the SoC die and the SerDes interface die in the SoC integrated circuit package. In contrast, the external transmission line is under the control of the mobile device manufacturer. The external transmission line may thus have a relatively large amount of capacitance and inductance as compared to an ideal impedance of, for example, 50 ?. But the internal transmission channel may have much lower parasitics with regard to its capacitance and inductance. For example, the SoC integrated circuit package may be formed using a package-on-package (PoP) architecture such that the internal transmission channel would comprise the copper pillars or solder bumps coupling from the bottom package (e.g., the SoC die) to the top package (e.g., the SerDes interface die). The capacitance and inductance of such interconnections is relatively small. Alternatively, the SoC integrated circuit package may be formed using a stacked-die architecture in which the internal transmission channel would include through substrate vias (TSVs) extending from the SoC die to the SerDes interface die. Such TSVs are also relatively small and thus have favorably low capacitance and inductance. In yet another embodiment, the SoC integrated circuit package may be a two-dimensional or 2.5 dimensional architecture in which the SoC die and the SerDes die are arranged side-by-side such that the internal transmission channel would comprise metal layer interconnections or leads between the two dies. Regardless of the particular construction for the SoC integrated circuit package, it will thus be appreciated that the electrical characteristics of the internal transmission channel may be relatively tightly controlled so as to be favorable for a high-speed data transmission between the two dies.

The favorable electrical characteristics of the internal transmission channel alleviate the design complication for a physical (PHY) layer interface in each of the dies for interfacing with the internal transmission channel. In particular, the SoC die includes an SoC PHY interface for accommodating the input/output communication over the internal transmission channel with the SerDes interface die. Similarly, the SerDes interface die includes an SerDes PHY interface for accommodating the input/output communication over the internal transmission channel with the SoC die. Both of these PHY interfaces may comprise a SerDes such that the communication over the internal transmission channel is serialized. In contrast to the SerDes in the SerDes interface die that drives the external transmission line, each PHY interface SerDes is relatively simplified due to the favorable electrical characteristics of the internal transmission channel. For example, each PHY interface SerDes may operate without any equalization in some embodiments. In other embodiments, each PHY interface SerDes may operate with only rudimentary equalization given the favorable electrical characteristics of the internal transmission channel.

For additional clarity, the analog SerDes components in the SerDes interface die are denoted herein as the "analog SerDes" to distinguish it from the SerDes in any of the PITY interfaces. As noted earlier, design of these analog SerDes components is becoming more and more problematic as the technology nodes grow more and more advanced. But the segregation of the analog SerDes into the SerDes interface die allows the SoC integrated circuit package designer to decouple the analog design complication from the digital design of the SoC die. For example, an older and more mature technology node (e.g., a planar CMOS process) may be used to construct the SerDes interface die. In contrast, the SoC die may be evolved to a more state-of-the art process node such as a FinFET process node or a nanowire process node.

The design of the PHY interfaces is further simplified through the segregation of the analog SerDes into the SerDes interface die since the analog SerDes includes a precision clock source such as a phase-locked loop (PLL). The clock from the PLL may be used by the SerDes in any of the PHY interfaces. Moreover, the SerDes PHY interface may be further simplified by eliminating its SerDes. In such an embodiment, the serialized data stream from the SoC PHY interface is not deserialized in the SerDes PHY interface but instead is passed through the SerDes PHY interface to the analog SerDes. The analog SerDes may then be simplified in that it no longer needs a serializer in such an embodiment. These advantageous features may be better appreciated through the following example embodiments.

Figure 2A:
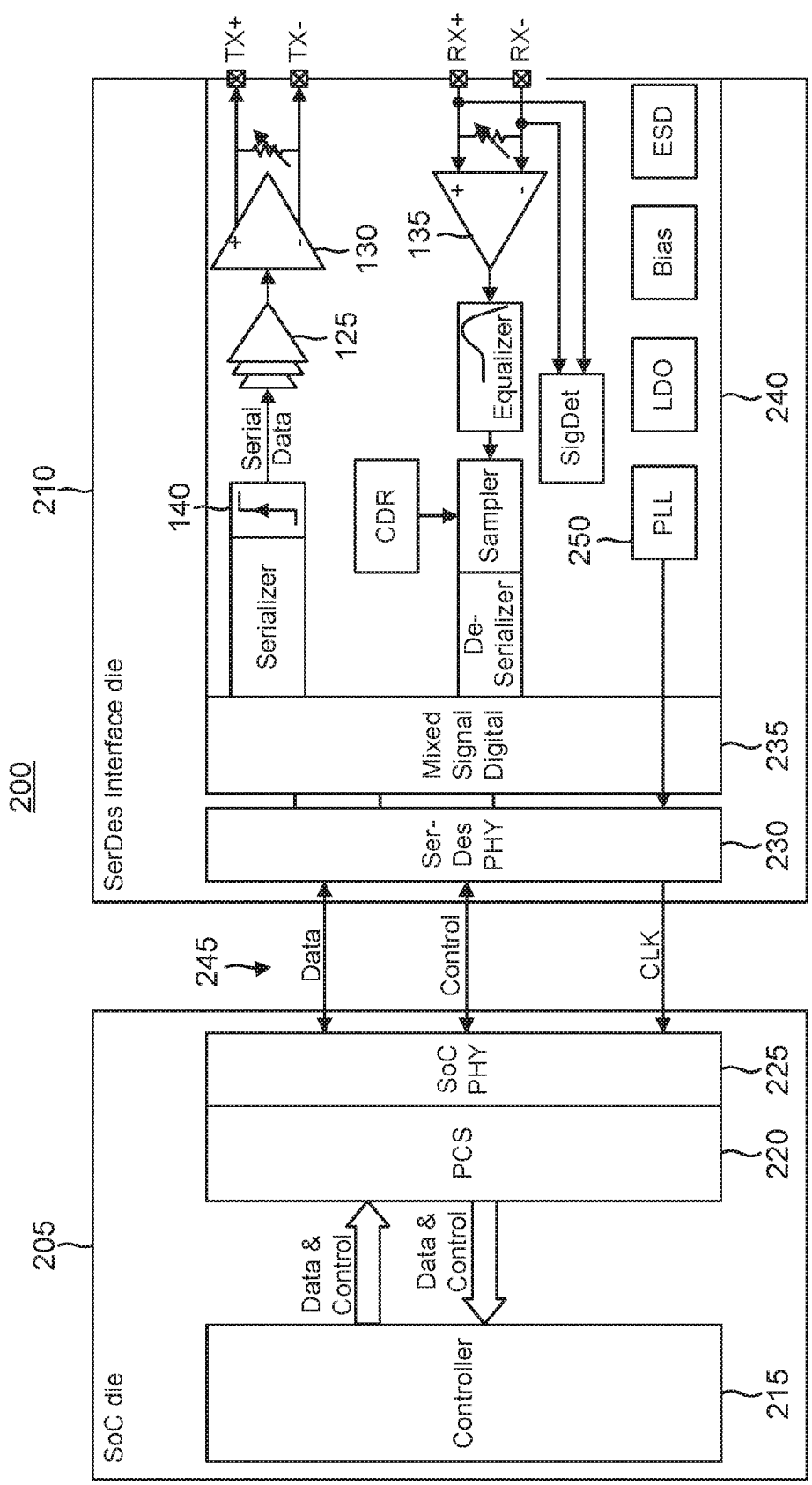
FIG. 2A is a diagram of an SoC die and a SerDes interface die in which each die includes a SerDes physical layer interface in accordance with an aspect of the disclosure.

An SoC integrated circuit package 200 is shown in FIG. 2A which contains both an SoC PHY interface 225 in an SoC die 205 and a SerDes PHY interface 230 in a SerDes interface die 210. SoC die 205 includes a controller 215 that generates data and control signals for SerDes interface die 210 and also receives data and control signals from SerDes interface die 210. Controller 215 transmits and receives the data and control signals through a physical coding sublayer (PCS) circuit 220. For example, controller 215 may present a digital word at some clock rate to PCS circuit 220. PCS circuit 220 adds the desired physical coding to each digital word and presents them to SoC PHY interface 225. SoC PHY interface 225 serializes each coded digital word into a serial data stream and drives the resulting serial data stream over an internal transmission channel 245 to SerDes PHY interface 230. SerDes PHY interface 230 may then deserialize the received serial data stream from internal transmission channel 245 into digital words. The serialization of the digital words from SerDes PHY interface 230 in an analog SerDes 240 may occur as discussed with regard to conventional SoC 100 (FIG. 1). Analog SerDes 240 thus includes a transmit path that includes a serializer, thresholding circuit 140, buffers 125, and differential transmitter 130. Note that the transmit path may also include an equalizer (not illustrated). Differential transmitter 130 then drives the amplified serial output from buffers 125 as a serial differential output data stream over the differential pair of output terminals TX+ and TX− that couple to an external transmission line (not illustrated). Similarly, analog SerDes 240 includes a receive path that includes differential receiver 135, an equalizer, a signal detector (SigDet), a sampler, a clock data recovery (CDR) circuit, and a de-serializer. A mixed signal digital circuit 235 in SerDes interface die 210 includes a built-in-self-test (BIST) for testing the operation of analog SerDes 240.

The design of internal transmission channel 245 depends upon the architecture for the packaging of SoC die 205 and SerDes interface die 210 to form SoC integrated circuit package 200. For example, in a package-on-package construction for package 200, internal transmission channel 245 would comprise the copper pillars or solder bumps that couple from the bottom die (e.g., SoC die 205) to the top die (e.g., SerDes interface die 210). Alternatively, internal transmission channel 245 would comprise through substrate vias and associated interconnections should package 200 be a stacked-die package. Moreover, internal transmission channel 245 may comprise metal layer interconnections (e.g., on an interposer) if SoC die 205 and SerDes interface die 210 are arranged side-by-side in package 200.

Figure 2B:
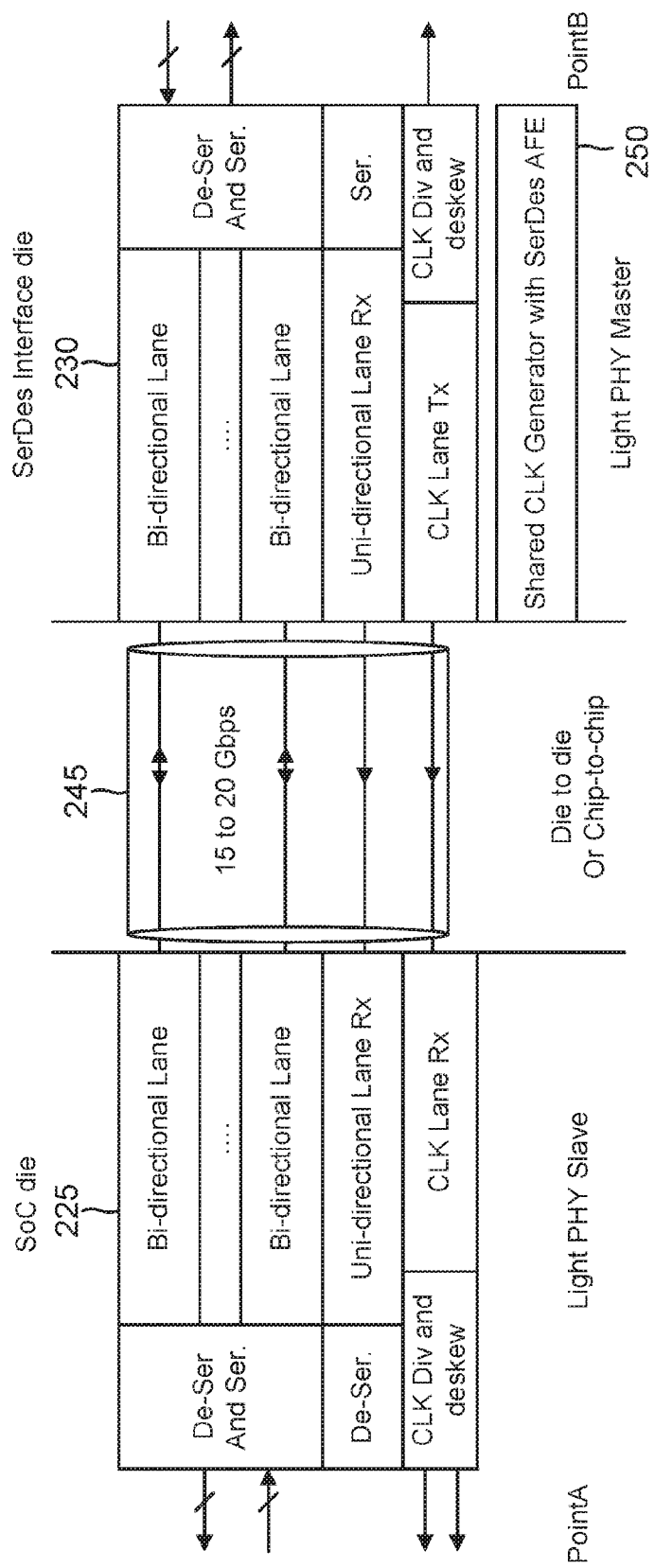
FIG. 2B is a diagram of the SerDes physical layer interfaces in the dies of FIG. 2A in accordance with an aspect of the disclosure.

As noted with regard to conventional SoC 100, analog SerDes 240 may also include an ESD circuit, a bandgap reference (Bias) circuit, and an LDO. Analog SerDes 240 also include a precision clock source such as PLL 250. PLL 250 provides a precision clock not only to the serializer in analog SerDes 240 but also to the serializer in each of the PHY interfaces 230 and 225, which are shown in more detail in FIG. 2B. SoC PHY interface 225 and SerDes PHY interface 230 may each include a plurality of bi-directional lanes in which serial data is both received and transmitted. For example, SoC PHY interface 225 includes a serializer that may drive serial data over its bi-directional lanes. Similarly, SoC PHY interface 225 includes a de-serializer for deserializing serial data received from SerDes PHY interface 230 over internal transmission channel 245. Internal transmission channel 245 includes a plurality of transmission channels to accommodate the multiple lanes of serial traffic. In this fashion, the speed requirements for serialization of each data stream is lessened. For example, a data rate of 20 Gbps may be accommodated using five bi-directional lanes that each support a 4 Gbps serial data transmission. SerDes PHY interface 230 includes an analogous serializer and de-serializer for its bi-directional lanes. Analog SerDes 240 can serialize the resulting multiple streams of data over the single pair of transmit pins TX+ and TX− because it may operate at a considerably faster data rate due to its more robust analog construction.

In addition, SoC PHY interface 225 may include a uni-directional lane for receiving a serial data stream from a corresponding serializer and uni-directional lane in SerDes PHY interface 230 as transmitted over internal transmission channel 245. PLL 250 functions as a shared clock (CLK) generator and is transmitted over a clock lane from SerDes PHY interface 230 over a transmission channel in internal transmission channel 245 to a corresponding clock lane in SoC PHY interface 225. Each PHY interface 225 and 230 may also include a corresponding clock de-skew and divider (DIV) circuit for its clock lane. Because the clock comes from SerDes PHY interface 230, it may be denoted as the master PHY interface whereas SoC PHY interface 225 may be denoted as the slave PHY interface. As noted earlier, both of these PHY interfaces may also be designated as a "light" PHY interface due to the lack of clock generation and the elimination of equalization (or just rudimentary equalization).

Figure 3:
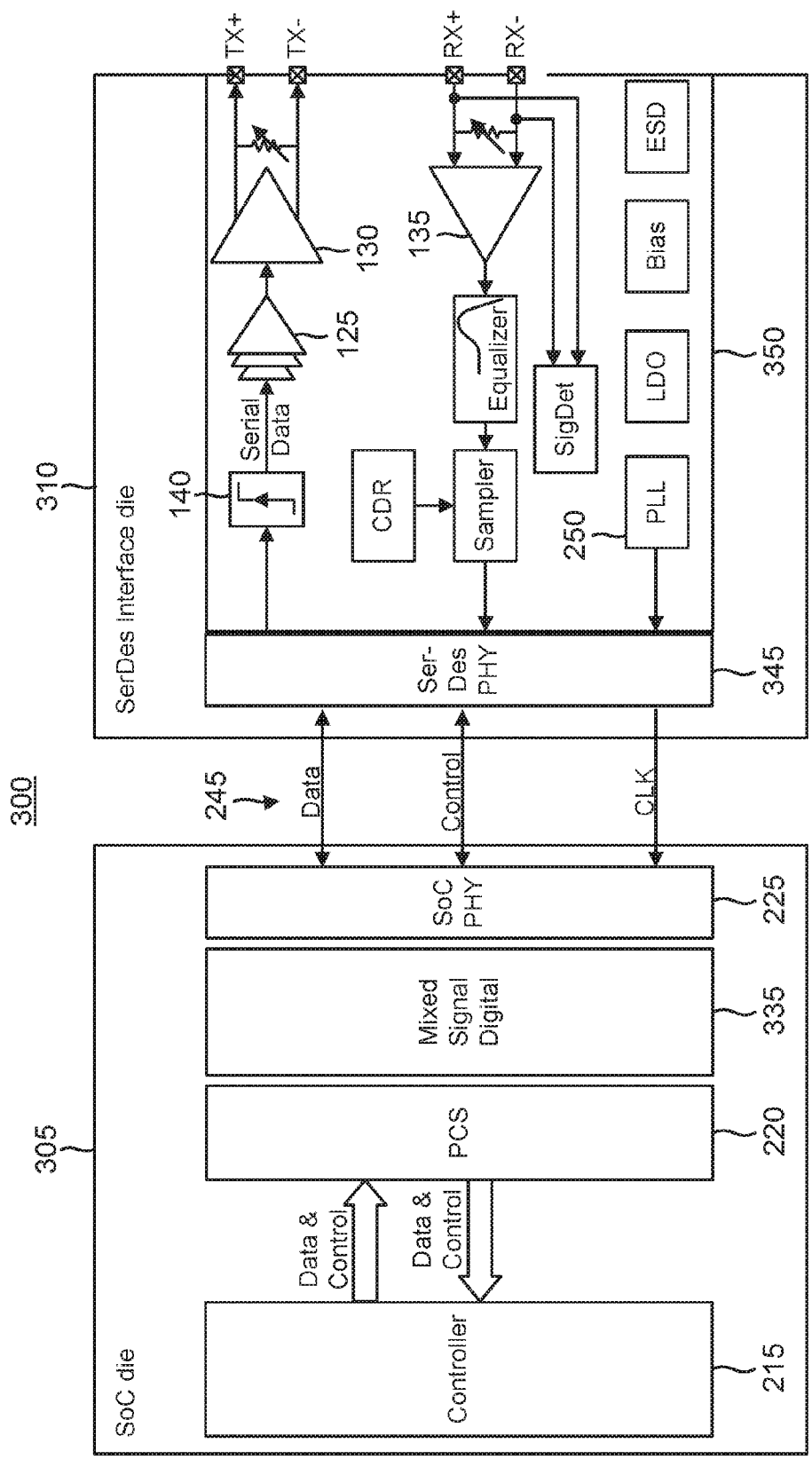
FIG. 3 is a diagram of an SoC die and a SerDes interface die in which a physical layer interface for the SerDes interface die does not deserialize a serial data stream from the SoC die in accordance with an aspect of the disclosure.

SerDes PHY interface 230 may be simplified further by eliminating its serializer and de-serializer. As shown in FIG. 3, serial data streams from an SoC die 305 may then be transmitted along the bi-directional lanes in such a modified SerDes PHY interface 345 in an SoC package 300. Since a BIST is a digital circuit design, a mixed signal digital circuit 335 including a BIST for testing an analog SerDes 350 in SerDes interface die 310 may be moved to SoC die 305. Controller 215, PCS circuit 220, and SoC PHY interface 225 function as discussed with regard to FIG. 2A. The serial data streams received in the bi-directional lanes for modified SerDes PHY interface 345 no longer need serialization such that the transmit path in analog SerDes 350 may be modified as discussed with regard to FIG. 2A by the exclusion of a serializer (although rate adaption would be necessary to adapt multiple serial data streams into a single serial data stream driven through the remaining transmit path consisting of thresholding circuit 140, buffers 125, and differential transmitter 130. PLL 250 in analog SerDes 350 is shared with SoC PHY interface 225 as discussed with regard to FIG. 2B. The receive path in analog SerDes 350 is also modified as compared to analog SerDes 240 of FIG. 2A in that the de-serializer may be omitted. SerDes PHY interface 345 performs rate adaptation to break the single serial data stream coming from the sampler into the multiple serial data streams distributed across the plurality of bi-directional lanes. The remaining components in analog SerDes 350 may be as discussed with regard to analog SerDes 240.

Figure 4:
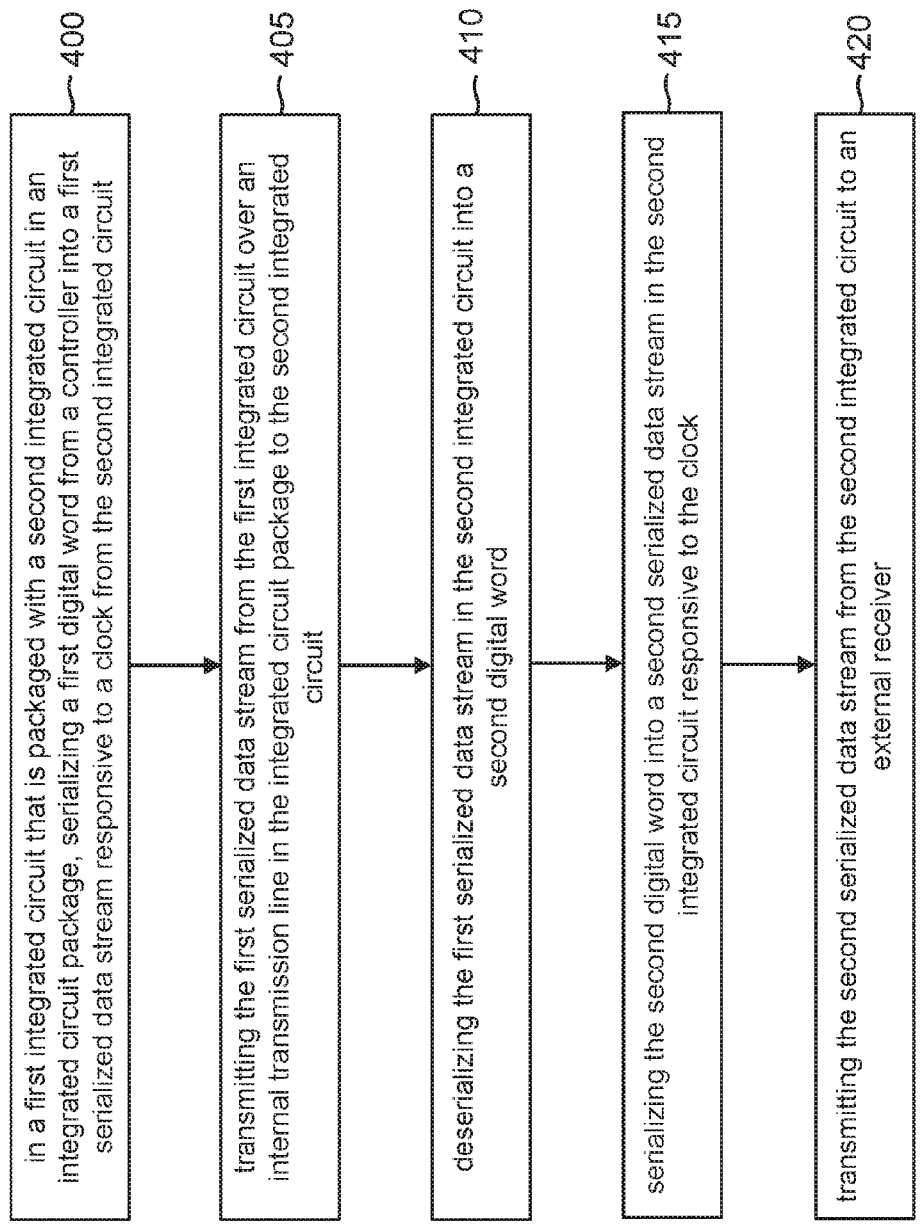
FIG. 4 is a flowchart for a method of operation of a split-die architecture in accordance with an aspect of the disclosure.

A method of operation for an SoC circuit package will now be discussed with regard to the flowchart of FIG. 4. The method includes an act 400 of, in a first integrated circuit that is packaged with a second integrated circuit in an integrated circuit package, serializing a first digital word from a controller into a first serialized data stream responsive to a clock from the second integrated circuit. The serialization of a coded data word from controller 110 (as coded by PCS circuit 220) in SoC PHY interface 225 is an example of act 400.

The method also includes an act 405 of transmitting the first serialized data stream from the first integrated circuit over an internal transmission channel in the integrated circuit package to the second integrated circuit. The transmission of serialized data over the bi-directional lanes in SoC PHY interface 225 through corresponding transmission channel in internal transmission channel 245 to SerDeS interface circuit 210 (or 310) is an example of act 405.

The method further includes an act 410 of deserializing the first serialized data stream in the second integrated circuit into a second digital word. The deserialization of the serial data streams from internal transmission channel 245 in SerDes PHY interface 230 is an example of act 410. The method also includes an act 415 of serializing the second digital word into a second serialized data stream in the second integrated circuit responsive to the clock. The serialization in the transmit path in analog SerDes 240 is an example of act 415. Although the serialization in acts 400 and 415 are both responsive to the clock, note that the serialization in act 400 may be at a slower rate due to the use of multiple lanes in the internal transmission channel. Thus, the serialization in act 400 may be responsive to every other cycle of the clock, or every third cycle of the clock, and so on. In contrast, the serialization in act 415 may be responsive to every cycle of the clock since it occurs at a faster rate.

Finally, the method includes an act 420 of transmitting the second serialized data stream from the second integrated circuit to an external receiver. The transmission by differential transmitter 130 in analog SerDes 240 is an example of act 420.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A method, comprising:
   in a first integrated circuit that is packaged with a second integrated circuit in an integrated circuit package, serializing a first digital word from a controller into a first serialized data stream responsive to a clock from the second integrated circuit;
   transmitting the first serialized data stream from the first integrated circuit over an internal transmission channel in the integrated circuit package to the second integrated circuit;
   deserializing the first serialized data stream in the second integrated circuit into a second digital word;
   serializing the second digital word into a second serialized data stream in the second integrated circuit responsive to the clock; and
   transmitting the second serialized data stream from the second integrated circuit to an external receiver.

2. The method of claim 1, wherein the first integrated circuit comprises a system-on-a-chip (SoC), the method further comprising generating the first digital word in the controller in the SoC.

3. The method of claim 2, further comprising:
   generating the clock in the second integrated circuit using a phase-locked loop.

4. The method of claim 2, further comprising coding the first digital word in the SoC using a physical coding sublayer (PCS) circuit.

5. The method of claim 1, wherein serializing the first digital word comprises serializing the first digital word without any equalization, and wherein serializing the second digital word comprises serializing the second digital word with equalization.

6. The method of claim 1, further comprising:
   deserializing an external serial stream of data from an external integrated circuit into a third digital word in the second integrated circuit;
   serializing the third digital word into a third serialized data stream in the second integrated circuit responsive to the clock;
   transmitting the third serialized data stream over the internal transmission channel to the first integrated circuit; and
   deserializing the third serialized data stream back into the third digital word in the first integrated circuit responsive to the clock.

7. The method of claim 6, wherein deserializing the external serial stream of data comprises deserializing the external serial stream of data with equalization, and wherein deserializing the third serialized data stream comprises deserializing the third serialized data stream without equalization.

8. The method of claim 1, wherein the first serialized data stream comprises a plurality of first serialized data streams each having a slower data rate as compared to a data rate for the second serialized data stream.

9. A system-on-a-chip (SoC) integrated circuit package, comprising:
   an SoC die including a controller configured to generate a first digital word and an SoC physical layer interface configured to serialize the first digital word into a first serial data stream responsive to a clock;
   a SerDes interface die; and
   an internal transmission channel coupled between the SoC die and the SerDes interface die, wherein the SoC physical layer interface is configured to drive the first serial data stream through the internal transmission channel to the SerDes interface die, wherein the SerDes interface die includes:
   a SerDes physical layer interface configured to receive the first serial data stream from the internal transmission channel and to deserialize the first serial data stream into a second digital word;
   a serializer configured to serialize the second digital word into a second serial data stream responsive to the clock;
   a differential transmitter configured to transmit the second serial data stream over a pair of differential transmit terminals to an external receiver outside of the SoC integrated circuit package; and
   a clock source configured to provide the clock.

10. The SoC integrated circuit package of claim 9, wherein the SoC integrated circuit package is a package-on-package (PoP), and wherein the internal transmission channel comprises a plurality of interconnections between a bottom package in the PoP and a top package in the PoP.

11. The SoC integrated circuit package of claim 10, wherein the bottom package is the SoC die and the top package is the SerDes interface die.

12. The SoC integrated circuit package of claim 9, wherein the SoC integrated circuit package is a stacked-die package, and wherein the internal transmission channel comprises a plurality of through substrate vias coupling from a bottom die in the stacked-die package to a top die in the stacked-die package.

13. The SoC integrated circuit package of claim 9, wherein the SoC die is arranged side-by-side with the SerDes interface die, and wherein the internal transmission channel comprises a plurality of metal layer interconnections between the SerDes interface die and the SoC die.

14. The SoC integrated circuit package of claim 9, wherein the SerDes interface die further includes a bandgap reference circuit and a low-dropout (LDO) regulator.

15. The SoC integrated circuit package of claim 9, wherein the clock source is a phase-locked loop (PLL).

16. The SoC integrated circuit package of claim 9, wherein the SerDes interface die further includes:
   a differential receiver configured to receive a differential serial data stream and output a third serial data stream
   a sampler configured to sample the third serial data stream responsive to a recovered clock from a clock data recovery (CDR) circuit to provide a sampled third serial data stream, and
   a deserializer configured to deserialize the sampled third serial data stream into a third digital word, wherein SerDes physical layer interface is further configured to serialize the third digital word into a fourth serial data stream responsive to the clock and to transmit the fourth serial data stream to the SoC die over the internal transmission channel.

17. A system-on-a-chip (SoC) integrated circuit package, comprising:
   an SoC die including a controller configured to generate a first digital word and an SoC physical layer interface configured to serialize the first digital word into a first serial data stream responsive to a clock;
   an internal transmission channel, wherein the SoC physical layer interface is configured to drive the first serial data stream through the internal transmission channel; and
   an interface die including:
   a physical layer interface configured to receive the first serial data stream and to convert the first serial data stream into a second serial data stream;
   a differential transmitter configured to transmit the second serial data stream to an external receiver over a pair of differential transmit terminals;
   a differential receiver configured to receive a differential serial data stream and output a third serial data stream;
   an equalizer configured to equalize the third serial data stream into an equalized serial data stream;
   a clock data recovery (CDR) circuit;
   a sampler configured to sample the equalized serial data stream responsive to a recovered clock from the CDR circuit to provide a sampled third serial data stream, wherein the physical layer interface is further configured to drive the sampled third serial data stream through the internal transmission channel to the SOC die; and
   a clock source configured to provide the clock.

18. The SoC integrated circuit package of claim 17, wherein the interface die further includes a bandgap reference circuit and a low-dropout (LDO) regulator.

19. The SoC integrated circuit package of claim 17, wherein the clock source is a phase-locked loop (PLL).

20. The SoC integrated circuit package of claim 17, wherein the SoC integrated circuit package is a package-on-package (PoP), and wherein the internal transmission channel comprises a plurality of interconnections between a bottom package in the PoP and a top package in the PoP.

21. The SoC integrated circuit package of claim 20, wherein the bottom package is the SoC die and the top package is the interface.

* * * * *